(12) United States Patent
Ide et al.

(10) Patent No.: US 7,881,024 B2
(45) Date of Patent: Feb. 1, 2011

(54) TUNNEL-TYPE MAGNETIC DETECTING ELEMENT AND METHOD OF MANUFACTURING THE SAME

(75) Inventors: Yosuke Ide, Niigata-ken (JP); Naoya Hasegawa, Niigata-ken (JP); Masamichi Saito, Niigata-ken (JP); Masahiko Ishizone, Niigata-ken (JP); Takuya Seino, Niigata-ken (JP); Kazumasa Nishimura, Niigata-ken (JP); Ryo Nakabayashi, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 1050 days.

(21) Appl. No.: 11/622,918

(22) Filed: Jan. 12, 2007

(65) Prior Publication Data
US 2007/0165337 A1   Jul. 19, 2007

(30) Foreign Application Priority Data
Jan. 13, 2006 (JP) .............................. 2006-005497

(51) Int. Cl.
*G11B 5/33* (2006.01)
(52) U.S. Cl. .................................................. 360/324.2
(58) Field of Classification Search .............. 360/324.2
See application file for complete search history.

(56) References Cited
U.S. PATENT DOCUMENTS

| | | | |
|---|---|---|---|
| 6,657,829 B2* | 12/2003 | Nakazawa et al. | 360/324.2 |
| 6,771,473 B2* | 8/2004 | Hiramoto et al. | 360/324.2 |
| 7,023,670 B2* | 4/2006 | Saito | 360/324.12 |
| 7,230,265 B2* | 6/2007 | Kaiser et al. | 257/30 |
| 7,253,995 B2* | 8/2007 | Takahashi et al. | 360/324.2 |
| 7,280,322 B2* | 10/2007 | Takahashi et al. | 360/324.1 |
| 7,598,555 B1* | 10/2009 | Papworth Parkin | 257/295 |
| 7,663,845 B2* | 2/2010 | Hirata et al. | 360/319 |
| 7,672,088 B2* | 3/2010 | Zhang et al. | 360/324.11 |
| 2003/0197987 A1* | 10/2003 | Saito | 360/324.12 |
| 2008/0032159 A1* | 2/2008 | Gill | 428/811.2 |

FOREIGN PATENT DOCUMENTS

| | | |
|---|---|---|
| JP | 2000-036628 | 2/2000 |
| JP | 2001-068757 | 3/2001 |
| JP | 2001-332781 | 11/2001 |
| JP | 2003-273420 | 9/2003 |
| JP | 2004-006589 | 1/2004 |
| JP | 2005-116701 | 4/2005 |

OTHER PUBLICATIONS

Office Action issued in corresponding Japanese Patent Application No. 2006-005497; issued Dec. 3, 2009.

* cited by examiner

*Primary Examiner*—Brian E Miller
(74) *Attorney, Agent, or Firm*—Brinks Hofer Gilson & Lione (57) ABSTRACT

A tunnel-type magnetic detecting element is provided. The tunnel-type magnetic detecting element includes a first ferromagnetic layer; an insulating barrier layer; and a second ferromagnetic layer. The first ferromagnetic layer, the second ferromagnetic layer, or both have a Heusler alloy layer contacting the insulating barrier layer. Equivalent planes represented by {110} surfaces, are preferentially oriented parallel to a film surface in the Heusler alloy layer. The insulating barrier layer is formed of MgO and the equivalent crystal planes represented by the {100} surfaces or the equivalent crystal planes represented by the {110} surfaces are oriented parallel to the film surface.

5 Claims, 8 Drawing Sheets

Full-Heusler
$X_2YZ[L2]$
● X(Co)   ○ Y(Mn)
■ X(Co)   ◉ Z

Full-Heusler
XYZ[C1b]
● X(Co)   ○ Y(Mn)
■ Void    ◉ Z

※ B2 STRUCTURE WITH A RANDOM ARRANGEMENT OF Y AND Z
※ A2 STRUCTURE WITH A RANDOM ARRANGEMENT OF X, Y AND Z

SODIUM CHLORIDE (NaCl) TYPE STRUCTURE
$Cl^-$ : CUBIC CLOSEST PACKING (FACE-CENTERED CUBIC LATTICE)
$Na^+$: O-site CRYSTAL STRUCTURE OF MgO

TUNNEL-TYPE MAGNETIC DETECTING ELEMENT AND METHOD OF MANUFACTURING THE SAME

This patent document claims the benefit of Japanese Patent Application No. 2006-005497 filed on Jan. 13, 2006, which is hereby incorporated by reference.

BACKGROUND

1. Field

The present embodiments relate to a tunnel-type detecting element and a method of manufacturing the same.

2. Related Art

JP-A-2004-006589 described below discloses a tunnel-type magnetic detecting element. JP-A-2004-006589 discloses that an insulating barrier layer (referred to as 'nonmagnetic spacer' in JP-A-2004-006589) is formed of oxidized insulation materials including $Al_2O_3$, MgO, $SiO_2$, $HfO_2$ and $SrTiO_3$ ([0192] of JP-A-2004-006589).

At least one of a first magnetic layer and a second magnetic layer is formed of materials having a body-centered cubic (bcc)-type crystal structure, a film surface thereof is oriented substantially parallel to (110) surfaces (claim 15 of JP-A-2004-006589).

Heusler alloy, which is a half metal, is used for the first magnetic layer or the second magnetic layer. As disclosed in [0015] of JP-A-2004-006589, it is possible to set theoretical resistance variation rate ($\Delta R/R$) to infinity by using the half metal.

However, it was possible to actually obtain at most several tens % ($\Delta R/R$). In the related art, it is difficult to get a sufficiently half metallic characteristic of Heusler alloy.

Since lattice matching does not occur in an interface between a Heusler alloy layer and the insulating barrier layer (a misfit ratio is high), a spin polarizability decreases in the vicinity of the interface. In addition, the insulating barrier layer formed of $Al_2O_3$; etc. is substantially an amorphous material and element diffusion occurs in the interface between the insulating barrier layer and the Heusler alloy layer, a film material of the insulating barrier layer or the Heusler alloy layer is deteriorated.

A specific method of improving a lattice matching property is not disclosed in JP-A-2004-006589.

SUMMARY

The present embodiments may obviate one or more of the limitations or drawbacks of the related art. For example, in one embodiment, a tunnel-type magnetic detecting element is capable of obtaining a high magneto-resistance variation rate by adjusting a crystal orientation between an insulating barrier layer and a Heusler alloy layer.

In one embodiment, a tunnel-type magnetic detecting element includes a first ferromagnetic layer; an insulating barrier layer; and a second ferromagnetic layer. The one ferromagnetic layer is a fixed magnetic layer which is fixed magnetized. The other ferromagnetic layer is a free magnetic layer which is variably magnetized by an external magnetic field. The first ferromagnetic layer, the second ferromagnetic layer, or the ferromagnetic layer and the second ferromagnetic layer has a Heusler alloy layer contacting the insulating barrier layer, and equivalent planes typically represented by {110} surfaces are preferentially oriented parallel to a film surface in the Heusler alloy layer. The insulating barrier layer is formed of MgO and the equivalent crystal planes typically represented by the {100} surfaces or the equivalent crystal planes typically represented by the {110} surfaces are preferentially oriented parallel to the film surface.

In one embodiment, it is possible to improve the lattice matching property between the Heusler alloy layer and the insulating barrier layer. It is also possible to improve the spin polarizability in the interface between the Heusler alloy layer and the insulating barrier layer, and suppress the element diffusion in the interface, thereby improving the resistance variation rate ($\Delta R/R$) compared to the related art.

In one embodiment, the equivalent crystal planes typically represented by the {100} surfaces are preferentially oriented parallel to the film surface in the insulating barrier layer. Accordingly, it is possible to improve a lattice matching property between the Heusler alloy layer and the insulating barrier layer more effectively, thereby obtaining even higher resistance variation rate ($\Delta R/R$)

In one embodiment, the first ferromagnetic layer is the fixed magnetic layer and the second ferromagnetic layer is the free magnetic layer. The first ferromagnetic layer at least has the Heusler alloy layer. It is possible to properly improve a crystal orientation of the insulating barrier layer formed of MgO.

In one embodiment, the Heusler alloy layer is formed of a metal compound having a Heusler-type crystal structure, which is represented by $X_2YZ$ and XYZ.

However, the X represents one or more kinds of elements out of Cu, Co, Ni, Rh, Pt, Au, Pd, Ir, Ru, Ag, Zn, Cd, or Fe. The Y represents one or more kinds of elements out of Mn, Fe, Ti, V, Zr, Nb, Hf, Ta, Cr, Co, or Ni. The Z represents one or more kinds of elements out of Al, Sn, In, Sb, Ga, Si, Ge, Pb, or Zn.

In one embodiment, the Heusler alloy layer is formed of the metal compound represented by the composition formula of $X_2YZ$. Accordingly, it is possible to obtain high spin polarizability.

In one embodiment, a method of manufacturing a tunnel-type magnetic detecting element including a first ferromagnetic layer, an insulating barrier layer, and a second ferromagnetic layer sequentially laminated from the bottom, wherein the one ferromagnetic layer is a fixed magnetic layer which is fixedly magnetized and the other ferromagnetic layer is a free magnetic layer which is variably magnetized by an external magnetic field comprises: (a) forming a Heusler alloy layer in which equivalent crystal planes typically represented by {100} surfaces are preferentially oriented parallel to a film surface, as at least a surface layer of the first ferromagnetic layer; and (b) sputter-forming the insulating barrier layer formed of MgO on the Heusler alloy layer by using an MgO target.

In one embodiment, in the insulating barrier layer formed of MgO, the equivalent crystal planes typically represented by the {100} surfaces are preferentially oriented parallel to the film surface. Therefore, it is possible to improve the lattice matching property in the interface between the first ferromagnetic layer and the insulating barrier layer, thereby properly or easily manufacturing the tunnel-type magnetic detecting element in which higher resistance variation rate ($\Delta R/R$) than in the related art can be obtained.

In one embodiment, a method of manufacturing a tunnel-type magnetic detecting element including a first ferromagnetic layer, an insulating barrier layer, and a second ferromagnetic layer sequentially laminated from the bottom, wherein the one ferromagnetic layer is a fixed magnetic layer which is fixedly magnetized and the other ferromagnetic layer is a free magnetic layer which is variably magnetized by an external magnetic field comprises: (c) sputter-forming the insulating barrier layer made of MgO on the first ferromagnetic layer by using an MgO target; and (d) forming a Heusler alloy layer in which equivalent crystal planes typically represented by {110} surfaces are preferentially oriented parallel to a film surface, as at least a part of the second ferromagnetic layer.

In one embodiment, in the insulating barrier layer formed of MgO, the equivalent crystal planes typically represented by the {100} surfaces are preferentially oriented parallel to the film surface. Therefore, it is possible to improve the lattice matching property in the interface between the second ferromagnetic layer and the insulating barrier layer, thereby properly or easily manufacturing the tunnel-type magnetic detecting element in which higher resistance variation rate ($\Delta R/R$) than in the related art can be obtained.

In one embodiment, it is preferable that the method of manufacturing a tunnel-type magnetic detecting element further comprises: (e) forming the Heusler alloy layer in which the equivalent crystal planes typically represented by the {110} surfaces are preferentially oriented parallel to a film surface, as at least a surface layer of the first ferromagnetic layer, prior to step (c).

Accordingly, it is possible to improve the lattice matching property in the interface between the first ferromagnetic layer and the insulating barrier layer. In this embodiment, it is possible to improve the lattice matching property in both the interface between the first ferromagnetic layer and the insulating barrier layer, and the interface between the second ferromagnetic layer and the insulating barrier layer, thereby properly or easily manufacturing the tunnel-type magnetic detecting element in which higher resistance variation rate ($\Delta R/R$) than in the related art can be obtained.

In the method of manufacturing the tunnel-type magnetic detecting element according to one embodiment, the insulating barrier layer formed of MgO may be formed by oxidizing an Mg layer after forming the Mg layer by the Mg target, instead of step (b) or step (c).

Accordingly, in the insulating barrier layer formed of MgO, the equivalent crystal planes typically represented by the {110} surfaces are preferentially oriented parallel to the film surface. Therefore, it is possible to improve the lattice matching property in the interface between the first ferromagnetic layer and the insulating barrier layer, the interface between the second ferromagnetic layer and the insulating barrier layer, or both the interface between the first ferromagnetic layer and the insulating barrier layer, and the interface between the second ferromagnetic layer and the insulating barrier layer, thereby properly or easily manufacturing the tunnel-type magnetic detecting element in which higher resistance variation rate ($\Delta R/R$) than in the related art can be obtained.

In the method of manufacturing the tunnel-type magnetic detecting element according to one embodiment, it is preferable that a set of steps of oxidizing the Mg layer are performed once more after formation of the Mg layer. Accordingly, it is possible to properly form the insulating barrier layer wholly formed of MgO without leaving disoxidized Mg.

In the method of manufacturing the tunnel-type magnetic detecting element according to another embodiment, the Heusler alloy layer is formed of a metal compound having a Heusler-type crystal structure, which is represented by $X_2YZ$ and XYZ.

However, the X represents one or more kinds of elements out of Cu, Co, Ni, Rh, Pt, Au, Pd, Ir, Ru, Ag, Zn, Cd, or Fe. The Y represents one or more kinds of elements out of Mn, Fe, Ti, V, Zr, Nb, Hf, Ta, Cr, Co, or Ni. The Z represents one or more kinds of elements out of Al, Sn, In, Sb, Ga, Si, Ge, Pb, or Zn.

In one embodiment, the Heusler alloy layer is formed of the metal compound represented by the composition formula of $X_2YZ$.

Accordingly, since the spin polarizability of the Heusler alloy layer increases, it is possible to properly or easily manufacture the tunnel-type magnetic detecting element in which resistance variation rate ($\Delta R/R$) is higher than in the related art.

In one embodiment, it is possible to improve the lattice matching property between the Heusler alloy layer and the insulating barrier layer. It is possible to improve the spin polarizability in the interface between the Heusler alloy layer and the insulating barrier layer, and suppress the element diffusion in the interface, thereby obtaining the tunnel-type magnetic detecting element having resistance variation rate ($\Delta R/R$) higher than that in the related art.

DETAILED DESCRIPTION

Figure 1:
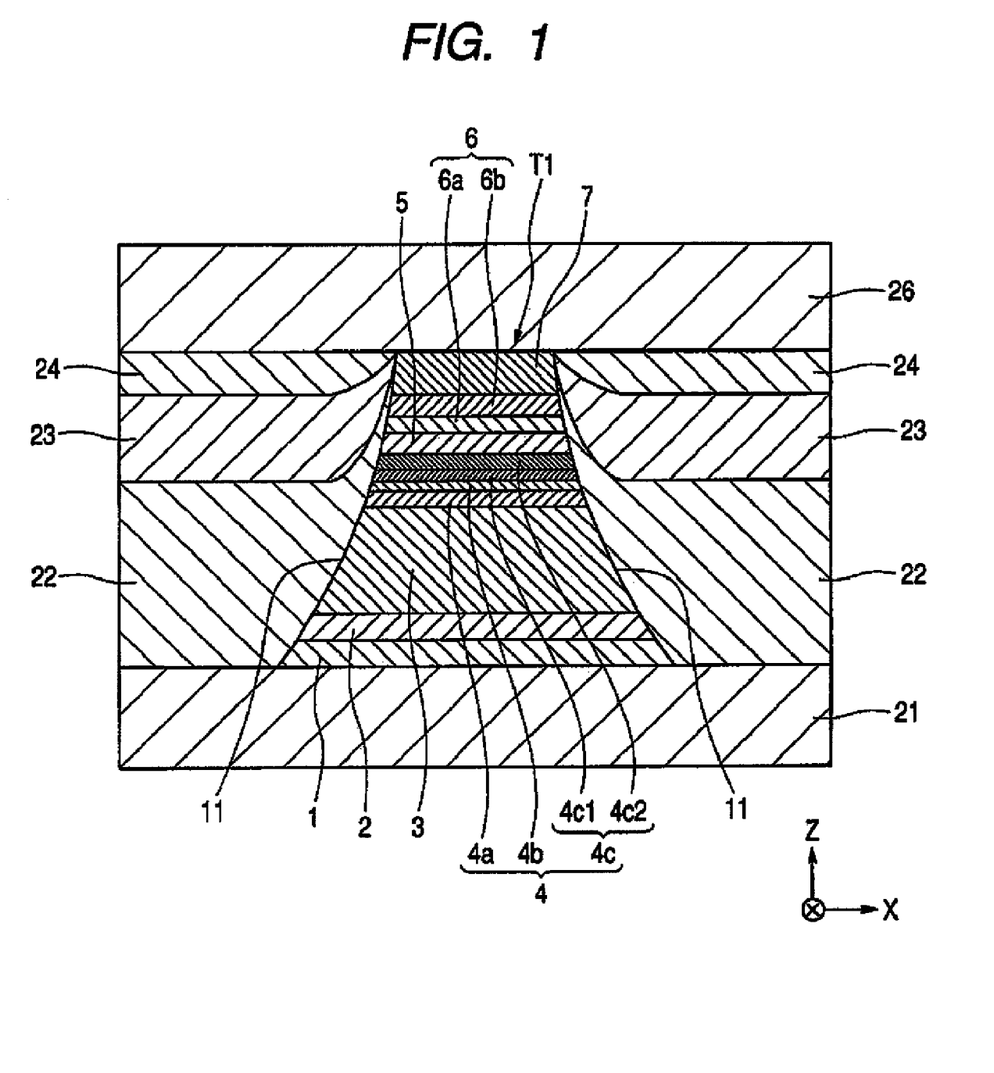
FIG. 1 is a cross-sectional view showing one embodiment of a reproducing head having a tunnel-type magnetoresistance effect element cut from a direction parallel to a recording medium.

FIG. 1 is a cross-sectional view of a structure in which a reproducing head having a tunnel-type magneto-resistance effect element is cut from a direction parallel to a surface opposite to a recording medium.

In one embodiment, the tunnel-type magneto-resistance effect element provided on a trailing end side of a floating slider provided in, for example, a hard disk device, detects a recording magnetic field of a hard disk or the like. In one embodiment, as shown in FIG. 1, an X direction corresponds to a track width direction, a Y direction corresponds to a direction of a leakage magnetic field from a magnetic recording medium (a height direction), and a Z direction corresponds to a moving direction of the magnetic recording medium such as the hard disk or the like and a laminated direction of each layer of the tunnel-type magneto-resistance effect element.

In one embodiment, as shown in FIG. 1, a lower shield layer 21 made of, for example, a NiFe alloy is formed on a lowermost layer. A laminated body T1 is formed on the lower shield layer 21. The tunnel-type-type magneto-resistance effect element includes the laminated body T1, and a lower insulating layer 22, a hard bias layer 23, and an upper insulating layer 24 formed on opposite sides of a track width direction (an x direction shown in FIG. 1) of the laminated body T1.

A lowermost layer of the laminated body T1 is a base layer 1 formed of one or more kinds of nonmagnetic materials of Ta, Hf, Nb, Zr, Ti, or W. A seed layer 2 is provided on the base layer 1. The seed layer 2 is formed of NiFeCr or Cr. If the seed layer 2 is formed of NiFeCr, the seed layer 2 has a face-centered cubic (fcc) structure in which equivalent crystal planes represented by {110} surfaces are preferentially oriented parallel to the film surface. If the seed layer 2 is formed of Cr, the seed layer 2 has a body-centered cubic (bcc) structure in which equivalent crystal planes represented by {110} surfaces are preferentially oriented parallel to a film surface. In addition, the base layer may not be formed below the seed layer 2.

In one embodiment, an antiferromagnetic layer 3 formed on the seed layer 2 is formed of an antiferromagnetic material including an element X (in this case, X represents one or more kinds of elements selected from Pt, Pd. Ir, Rh, Ru, or Os) and Mn or an antiferromagnetic material including the element X, an element X' (in this case, the element X' is one more kinds or two or more kinds of elements selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Xa, W, Re, Au, Pb, or rare earth elements), and Mn. For example, an antiferromagnetic exchange coupling magnetic field ferromagnetic layer 3 is formed of IrMn or PtMn.

In one embodiment, a fixed magnetic layer 4 is formed on the antiferromagnetic layer 3. The fixed magnetic layer 4 has a laminated ferromagnetic structure in which a first fixed magnetic layer 4a, a nonmagnetic intermediate layer 4b, and a second fixed magnetic layer 4c are laminated layer by layer from the bottom. Magnetization directions of the first fixed magnetic layer 4a and the second fixed magnetic layer 4c are antiparallel to each other. This structure is referred to as the laminated ferromagnetic structure. By this structure, magnetization of the fixed magnetic layer 4 can be stabilized and the exchange coupling magnetic field generated in the interface between the fixed magnetic layer 4 and the antiferromagnetic layer can be externally increased.

The first fixed magnetic layer 4a is formed of ferromagnetic materials, for example, CoFe, NiFe, and CoFeNi. The nonmagnetic intermediate layer 4b is formed of nonmagnetic conductive materials, for example, Ru, Rh, Ir, Cr, Re, and Cu.

The second fixed magnetic layer 4c has a laminated structure of a ferromagnetic layer 4c1 and a Heusler alloy layer 4c2. The ferromagnetic layer 4c1 is formed of ferromagnetic material, for example, CoFe, NiFe, or CoFeNi.

A Heusler alloy is a general term of metal compounds having a Heusler-type crystal structure and shows ferromagnetism in accordance with the composition of the Heusler alloy. The Heusler alloy is a metal having high spin polarizability and a half metal of which most of conduction electros are formed of any one of upspin electrons and downspin electrons.

The Heusler alloy layer 4c2 is preferably formed of a metal compound having the Heusler-type crystal structure represented by $X_2YZ$ or XYZ. However, X is formed of one or more kinds of elements out of Cu, Co, Ni, Rh, Pt, Au, Pd, Ir, Ru, Ag, Zn, Cd, or Fe. Y is formed of one or more kinds of elements out of Mn, Fe, Ti, V, Zr, Nb, Hf, Ta, Cr, Co, or Ni. Z is formed of one or more kinds of elements out of Al, Sn, In, Sb, Ga, Si, Ge, Pb, or Zn.

When the Heusler alloy layer 4c2 is formed of the metal compound having the Heusler-type crystal structure represented by XYZ, the Heusler alloy layer 4c2 is formed of NiMnSb, CoMnSb, PdMnSb, or PtMnSb. Further, When the Heusler alloy layer 4c2 is formed of the metal compound having the Heusler-type crystal structure represented by $X_2YZ$, the Heusler alloy layer 4c2 is formed of $Co_2FeAl$, $Co_2FeSi$, $Co_2FeGa$, $Co_2FeGe$, $Co_2MnAl$, $Co_2MnSi$, $Co_2MnGa$, $Co_2MnGe$, or $Co_2MnSn$.

The Heusler alloy layer 4c2 is formed of the metal compound represented by a composition formula of $X_2YZ$.

The element X preferably includes Co. The element Y preferably includes Mn or Fe. For example, the Heusler alloy layer 4c2 is formed of $Co_2FeAl$, $Co_2MnGe$, or $Co_2MnSi$.

In one embodiment, the insulating barrier layer 5, which forms the fixed magnetic layer 4, is formed of MgO. A free magnetic layer (a second ferromagnetic layer) 6 is formed on the insulating barrier layer 5. The free magnetic layer 6 includes a soft magnetic layer 6b formed of the magnetic material such as a NiFe alloy and an enhance layer 6a formed CoFe alloy disposed between the soft magnetic layer 6b and the insulating barrier layer 5. The soft magnetic layer 6b is preferably formed of the magnetic material having excellent soft magnetic property. The enhance layer 6a is preferably formed of the magnetic material having higher spin polarizability than the soft magnetic layer 6a. The enhance layer 6a is formed of the magnetic material such as the CoFe alloy having high spin polarizability, thereby improving the resistance variation rate ($^\Delta R/R$).

The free magnetic layer 6 may have a laminated ferri structure in which a plurality of magnetic layers are laminated via the intermediate layer. In addition, a track width Tw is determined with a width in a track width direction (an X direction shown in FIG. 1) of the free magnetic layer 6.

A protective layer 7 made of the nonmagnetic conductive material such as Ta is formed on the free magnetic layer 6.

As shown in FIG. 1, opposite end faces 11 and 11 in the track width direction of the laminated body T1 are formed of inclined surfaces to decrease the width in the track width direction toward an upper side from a lower side.

As shown in FIG. 1, the lower insulating layer 22 is formed on the lower shield layer 21 widened toward opposite sides of the laminated body T1 through the opposite end faces of the laminated body T1. The hard bias layer 23 is formed on the lower insulating layer 22. The upper insulating layer 24 is formed on the hard bias layer 23.

A bias base layer (not shown) may be formed between the lower insulating layer 22 and the hard bias layer 23. For example, the bias base layer may be made of Cr, W, or Ti.

The insulating layers 22 and 24, which may be made of insulating material, for example, $Al_2O_3$ or $SiO_2$, insulates an upside and a downside of the hard bias layer 23 to keep current flowing on the in a direction perpendicular to the interface of each layer from being divided into the opposite sides in the track width direction of the laminated body T1. For example, the hard bias layer 23 is made of Co—Pt (cobalt-platinum) alloy or Co—Cr—Pt (cobalt-chrome-platinum) alloy.

The upper shield layer 26, which is made of the NiFe alloy, is formed on the laminated body T1 and the upper insulating layer 24.

In an embodiment shown in FIG. 1, the lower shield layer 21 and the upper shield layer 26 serve as an electrode layer for the laminated body T1. Current flows in a direction (a direction parallel to a Z direction shown in FIG. 1) perpendicular to the film surface of each layer of the laminated body T1.

In one embodiment, the free magnetic layer 6 is magnetized in the direction parallel to the track width direction (the X direction shown in FIG. 1) while receiving a bias magnetic field from the hard bias layer 23. The first fixed magnetic layer 4a and the second fixed magnetic layer 4c constituting the fixed magnetic layer 4 are magnetized in a direction parallel to a height direction (a Y direction shown in FIG. 1). Since the fixed magnetic layer 4 has the laminated ferri structure, the first fixed magnetic layer 4a and the second fixed magnetic layer 4c each are magnetized antiparallel to the height direction. The fixed magnetic layer 4 is fixedly magnetized (magnetization is not varied by an external magnetic field), while the free magnetic layer 6 is variably magnetized by the external magnetic field.

The magnetization of the free magnetic layer 6 is varied by the external magnetic field and the magnetization of the second fixed magnetic layer 4c and the magnetization of the free magnetic layer are antiparallel to each other. Tunnel-type current may become difficult to flow via the insulating barrier layer 5 provided between the second fixed magnetic layer 4c and the free magnetic layer 6. Therefore, a resistance value is maximized. In one embodiment, when the magnetization of the second fixed magnetic layer 4c and the magnetization of the free magnetic layer 6 are parallel to each other, the maximum tunnel-type current may become easy to flow. Therefore, the resistance value is minimized.

According to the principle, the magnetization of the free magnetic layer 6 is varied under an influence of the external magnetic field and a varied electrical resistance is grasped by a change in voltage and a leak magnetic field from a recording medium is detected.

In one embodiment, as shown in FIG. 1, the Heusler alloy layer 4c2 is formed as a surface layer of the second fixed magnetic layer 4c, equivalent crystal planes represented by the {110} surfaces are preferentially oriented parallel to a film surface (X-Y plane shown in FIG. 1) in the Heusler alloy layer 4c2, the insulating barrier layer 5 attached to the Heusler alloy layer 4c2 is made of MgO, and the equivalent crystal planes typically represented by {100} surfaces or the {110} surfaces are oriented in the direction to the film surface (the X-Y plane shown in FIG. 1).

Herein, "the crystal planes typically represented by the {110} surfaces" are crystal lattice planes shown using the Miller's index. The equivalent crystal planes represented by the {110} surfaces include the (110) surfaces, (–110) surfaces, (1-10) surfaces, (–1-10) surfaces, (101) surfaces, (–101) surfaces, (10-1) surfaces, (–10-1) surfaces, (011) surfaces, (0-11) surfaces, (01-1) surfaces, and (0-1-1) surfaces.

In addition, "the crystal planes typically represented by the {100} surfaces" are the crystal lattice planes shown using the Miller's index. The equivalent crystal planes represented by the {100} surfaces include the (100) surfaces, (–100) surfaces, (010) surfaces, (0-10) surfaces, (001) surfaces, and (00-1) surfaces.

Figure 3:
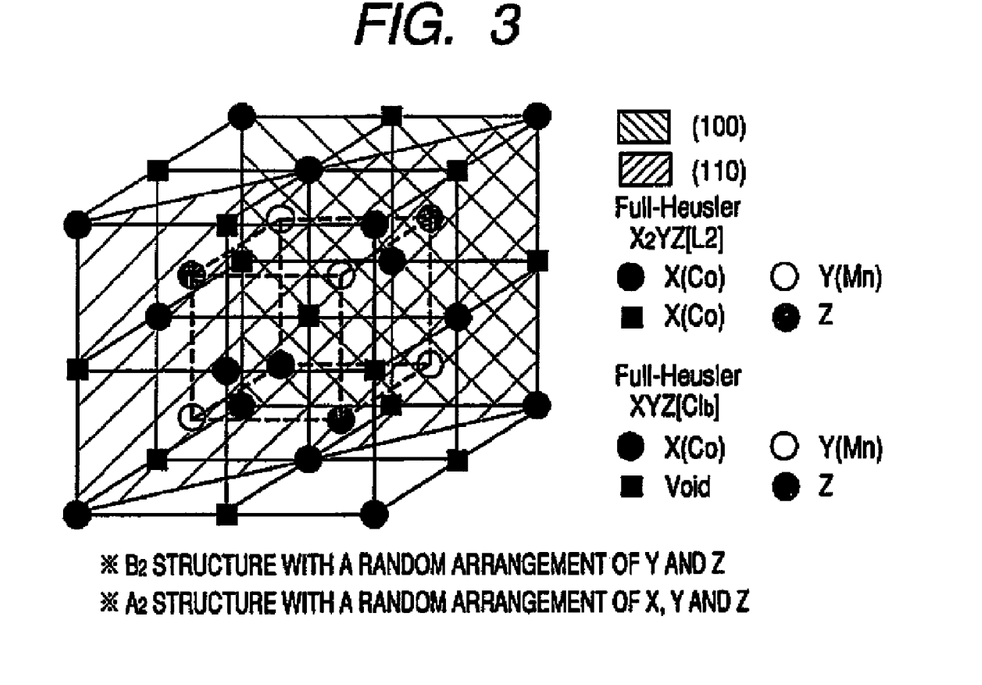
FIG. 3 shows a crystal structure of a Hesuler alloy represented by $X_2YZ$ or XYZ.
Figure 4:
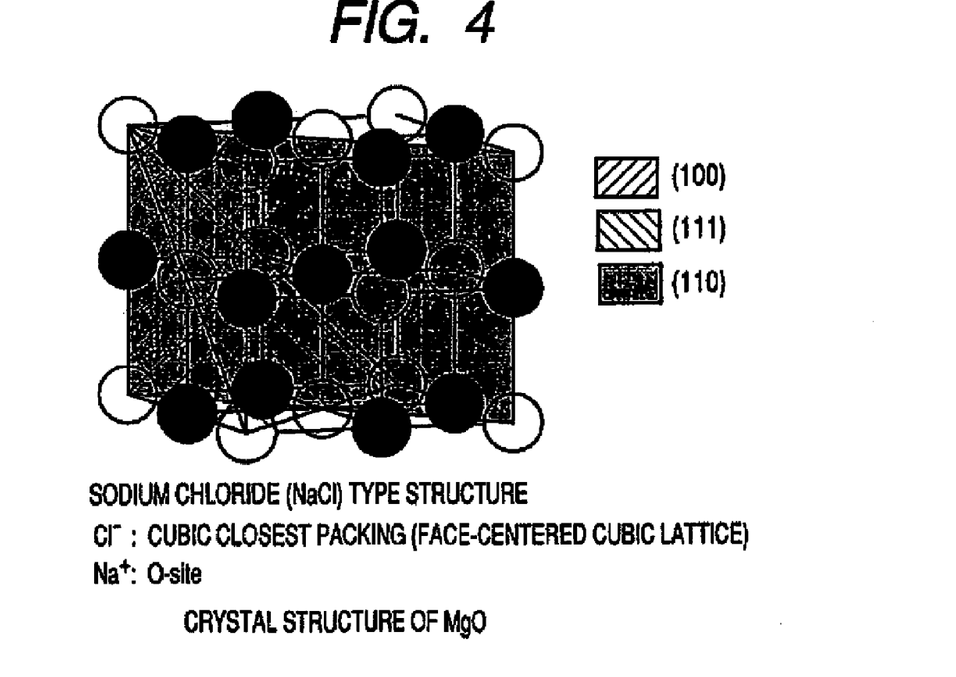
FIG. 4 shows a crystal structure of MgO.

FIG. 3 shows a crystal structure of the Heusler alloy represented by $X_2YZ$ or XYZ and FIG. 4 shows a crystal structure of MgO. The element X constituting the Heusler alloy includes Co and the element Y includes Mn.

Figures 5A, 5B:
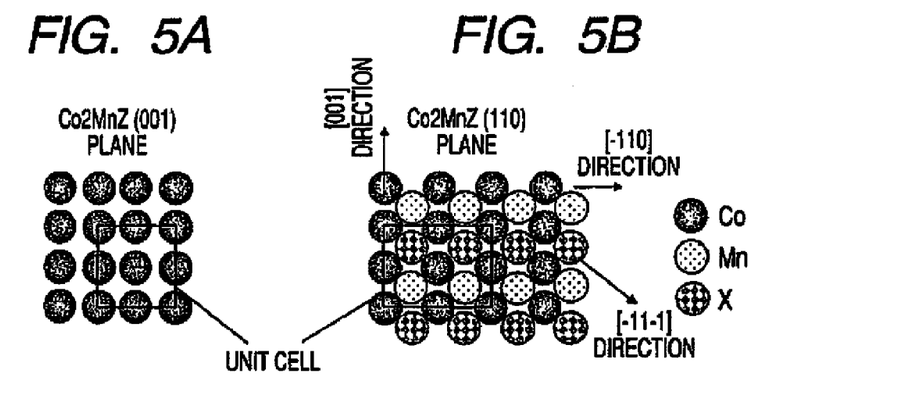
FIG. 5A shows the atomic arrangement of (001) surfaces of $Co_2MnZ$.
FIG. 5B shows the atomic arrangement of (110) surfaces of $Co_2MnZ$.

FIGS. 5A and 5B show the (100) surfaces and the (110) surfaces of the Heusler alloy of $Co_2MnZ$ shown in FIG. 3 as viewed from in a direction perpendicular to the respective surfaces. FIG. 5A shows an atomic arrangement of the (001) surfaces (equivalent planes of the (100) surfaces) of $Co_2MnZ$ and FIG. 5B shows the atomic arrangement of the (110) surfaces of $Co_2MnZ$.

Figures 6A, 6B:
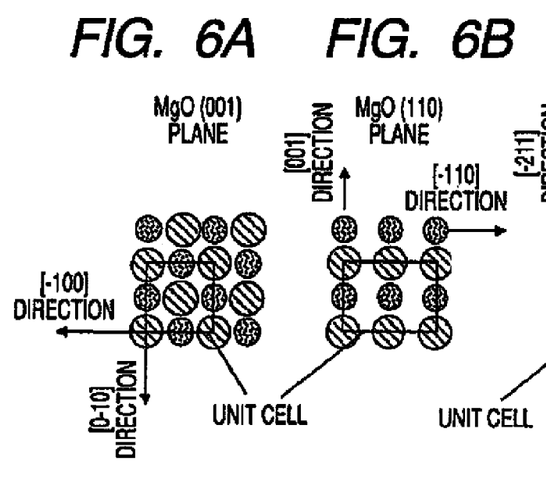
FIG. 6A shows the atomic arrangement of (001) surfaces of MgO.
FIG. 6B shows the atomic arrangement of (110) surfaces of MgO.
Figure 6C:
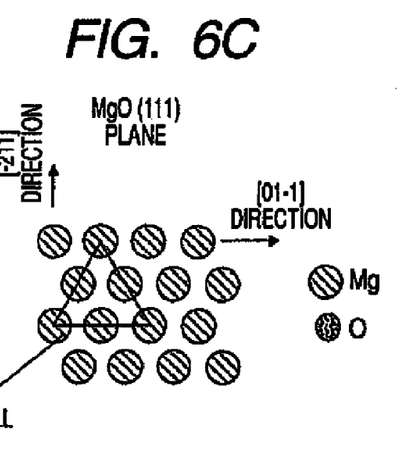
FIG. 6C shows the atomic arrangement of (111) surfaces of MgO.

FIGS. 6A, 6B, and 6C show the (100) surfaces, the (110) surfaces and the (111) surfaces of MgO shown in FIG. 4 as viewed from a direction perpendicular to the respective surfaces. FIG. 6A shows the atomic arrangement of the (001) surfaces (the equivalent surfaces of the (100) surfaces) of MgO. FIG. 6B shows the atomic arrangement of the (110) surfaces of MgO. FIG. 6C shows the atomic arrangement of the (111) surfaces of MgO.

As shown in FIG. 3, the Heusler alloy layer 4c2 has a body-centered cubic structure (a bcc structure). The {100} surfaces having a maximum compactness are preferentially oriented parallel to the film surface (the X-Y plane shown in FIG. 3) in the Heusler alloy layer.

Any one of the {100} surfaces, the {110} surfaces, and the {111} surfaces shown in FIGS. 6A, 6B, and 6C are preferentially oriented in the direction parallel to the film surface (the X-Y plane shown in FIG. 3) in the insulating barrier layer 5 of MgO formed on the Heusler alloy layer 4c2.

Figure 7:
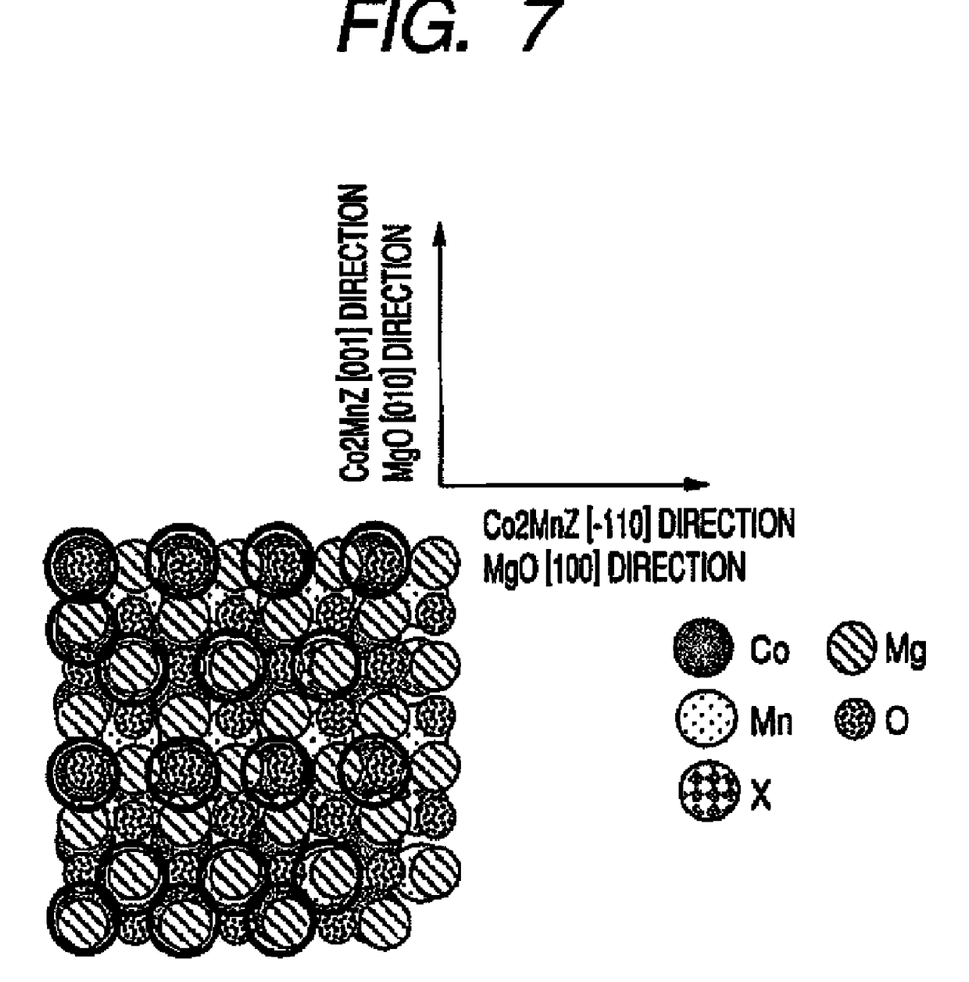
FIG. 7 shows the atomic arrangement when (001) surfaces of MgO shown in FIG. 6A are overlapped with (110) surfaces of $Co_2MnZ$ shown in FIG. 5B as viewed immediately from an upper side.

FIG. 7 shows the atomic arrangement when the (001) surfaces of MgO shown in FIG. 6A are overlapped with the (110) surfaces of $Co_2MnZ$ shown in FIG. 5B as viewed immediately from an upper side.

In one embodiment, as shown in FIG. 7, Oxygen atoms, on the upper left side of the plane shown in FIG. 6B, are overlapped with a center of Co atoms on the upper left side of the plane FIG. 5B. A [001] direction of $Co_2MnZ$ and a [010] direction of MgO are set to be the same. A [–110] direction of $Co_2MnZ$ and a [100] direction of MgO are set to be the same. For example, one equivalent crystal direction of $Co_2MnZ$ typically represented by <100> and another equivalent crystal direction of MgO typically represented by <100> are set to be the same in the direction perpendicular to the film surface. One equivalent crystal direction of $Co_2MnZ$ typically represented by <110> and the other equivalent crystal direction of MgO typically represented by <100> are set to be the same in the direction perpendicular to the film surface. Since the atomic arrangement is stable in energy, the crystal direction of $Co_2MnZ$ and the crystal direction of MgO are substantially set to be the same as described above in the actual atomic arrangement.

In a location surrounded by circles shown in FIG. 7, atoms of $Co_2MnZ$ and atoms of MgO are substantially overlapped with each other in a film thickness direction.

Figure 8A:
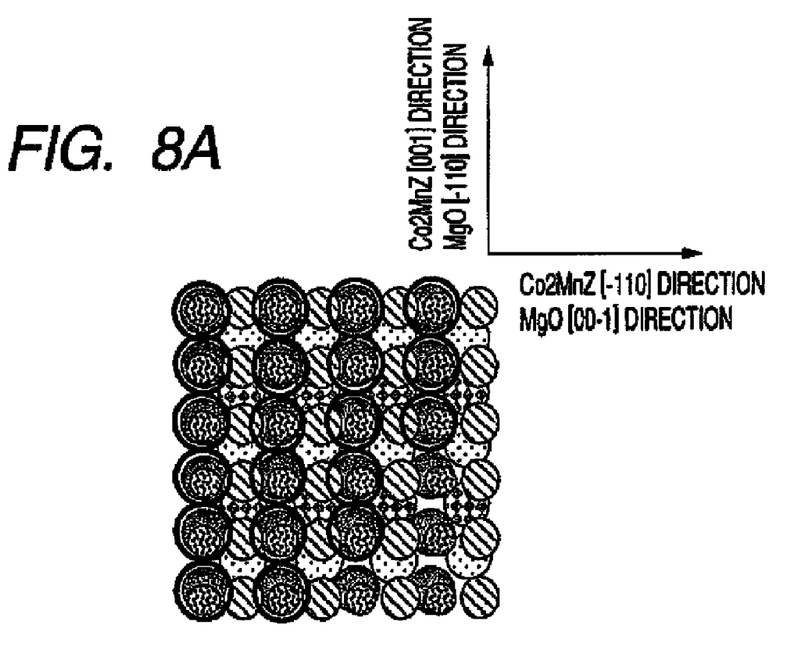
FIG. 8 shows the atomic arrangement when (110) surfaces of MgO shown in FIG. 6B are overlapped with (110) surfaces of $Co_2MnZ$ shown in FIG. 5B as viewed immediately from an upper side.
Figure 8B:
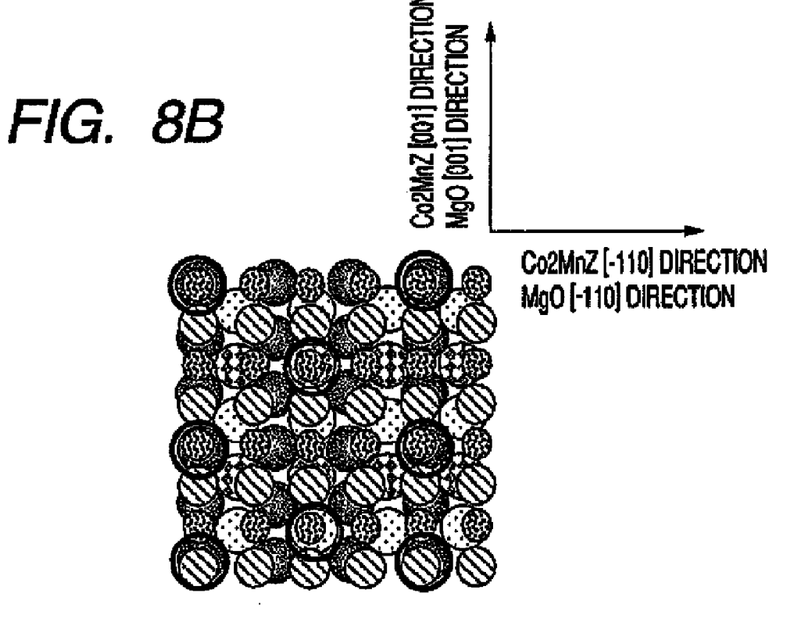

FIGS. 8A and 8B show the atomic arrangement when the (110) surfaces of MgO shown in FIG. 6B are overlapped with the (110) surfaces of $Co_2MnZ$ shown in FIG. 5B as viewed immediately from an upper side.

In one embodiment, as shown in FIG. 8A, when the (110) surfaces of MgO shown in FIG. 6B is rotated at 90 degrees on the rotation axis perpendicular to the plane, one rotated Oxygen atom of MgO is overlapped with the center of the Co atom on the upper left side of the plane FIG. 5B and a [001]

direction of $Co_2MnZ$ and a [−110] direction of MgO are set to be the same. A [−110] direction of $Co_2MnZ$ and a [00-1] direction of MgO are set to be the same. For example, one equivalent crystal direction of $Co_2MnZ$, typically represented by <100>, and the other equivalent crystal direction of MgO, typically represented by <110>, are set to be the same in the direction perpendicular to the film surface. One equivalent crystal direction of $Co_2MnZ$ typically represented by <110> and the other equivalent crystal direction of MgO typically represented by <100> are set to be the same in the direction perpendicular to the film surface.

In one embodiment, as shown in FIG. 8B, the Oxygen atoms on the upper left side of the plane shown in FIG. 6B are overlapped with a center of Co atoms on the upper left side of the plane FIG. 5B. A [001] direction of $Co_2MnZ$ and a [001] direction of MgO are set to be the same. A [−110] direction of $Co_2MnZ$ and a [−110] direction of MgO are set to be the same. For example, one equivalent crystal direction of $Co_2MnZ$ typically represented by <100> and the other equivalent crystal direction of MgO typically represented by <100> are set to be the same in the direction perpendicular to the film surface. One equivalent crystal direction of $Co_2MnZ$ typically represented by <110> and the other equivalent crystal direction of MgO typically represented by <100> are set to be the same in the direction perpendicular to the film surface. Further, the actual atomic arrangement may be any one of the atomic arrangements shown in FIGS. 8A and 8B which are stable in energy.

When the (110) surfaces of MgO are laminated on the (110) surfaces of the state of $Co_2MnZ$ as shown in FIG. 8A and the (110) surfaces of MgO is rotated at 90 degrees on a rotation axis perpendicular to a plane from the state of FIG. 8A, as shown in FIG. 8B, the atomic arrangement of the (110) surfaces of $Co_2MnZ$ and the atomic arrangement of the (110) surfaces of MgO are relatively different from each other in the film thickness direction unlike a case of FIG. 7. Therefore, two kinds of connection patterns are generated as shown in FIGS. 8A and 8B.

In addition, in case that the (110) surfaces of MgO are preferentially oriented parallel to the film surface, the atomic arrangement of FIG. 8A and the atomic arrangement of FIG. 8B are mixed.

In the location surrounded by the circles shown in FIGS. 8A and 8B, the atoms of $Co_2MnZ$ and the atoms of MgO are substantially overlapped with each other.

Figure 9A:
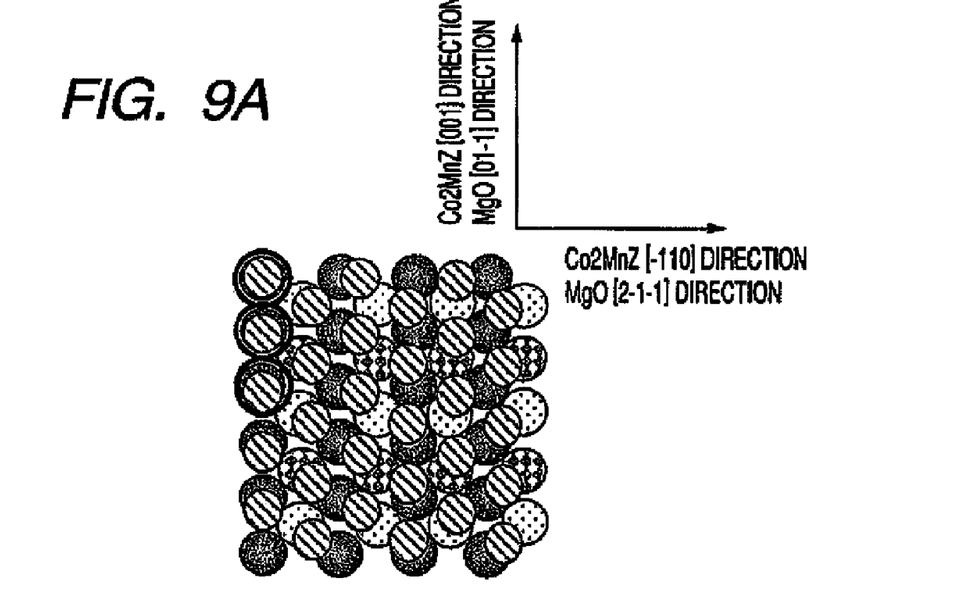
FIG. 9 shows the atomic arrangement when (111) surfaces of MgO shown in FIG. 5C are overlapped with (110) surfaces of $Co_2MnZ$ shown in FIG. 5A as viewed immediately from an upper side.
Figure 9B:
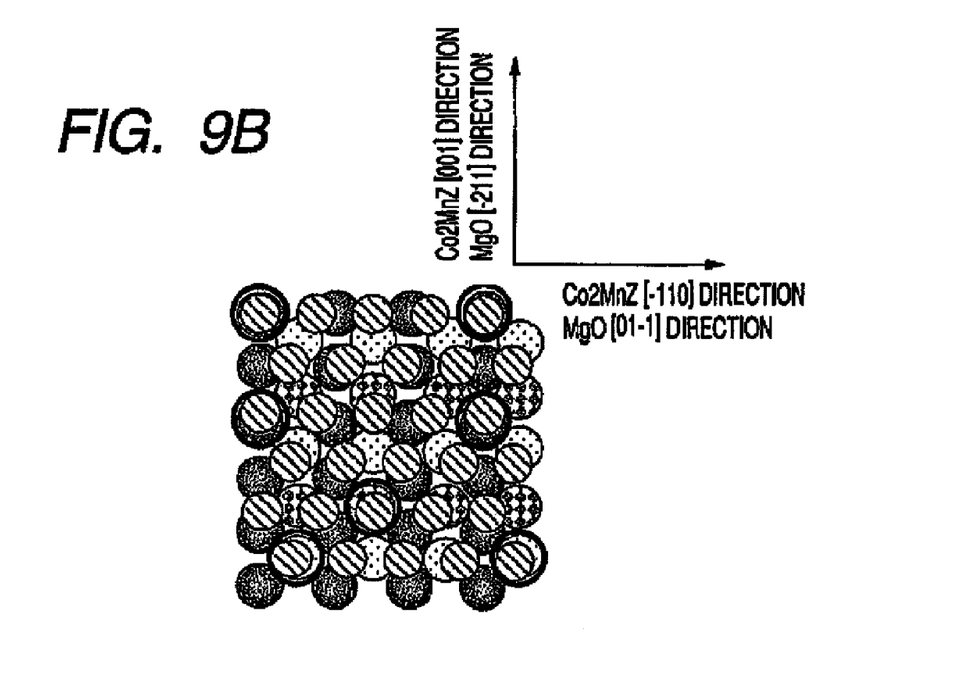

FIGS. 9A and 9B show the atomic arrangements when the (111) surfaces of MgO shown in FIG. 6C are overlapped with the (110) surfaces of $Co_2MnZ$ shown in FIG. 5B as viewed immediately from the upper side.

In one embodiment, as shown in FIG. 9A, when the (111) surfaces of MgO shown in FIG. 6C is rotated at 90 degrees on the rotation axis perpendicular to the plane, one rotated Mg atom of MgO is overlapped with the center of the Co atom on the upper left side of the plane FIG. 5B and a [001] direction of $Co_2MnZ$ and a [01-1] direction of MgO are set to be the same. A [−110] direction of $Co_2MnZ$ and a [2-1-1] direction of MgO are set to be the same.

In one embodiment, as shown in FIG. 9B, the Mg atom of MgO rotated in a direction shown in FIG. 6C is overlapped with the center of the Co atom on the upper left side of the plane FIG. 5B and a [001] direction of $Co_2MnZ$ and a [−211] direction of MgO are set to be the same. A [−110] direction of $Co_2MnZ$ and a [01-1] direction of MgO are set to be the same.

When the (111) surfaces of MgO are laminated on the (110) surfaces of the state of $Co_2MnZ$ as shown in FIG. 9A and the (111) surfaces of MgO is rotated at 90 degrees on a rotation axis perpendicular to a plane from the state of FIG. 9A as shown in FIG. 9B, the atomic arrangement of the (110) surfaces of $Co_2MnZ$ and the atomic arrangement of the (111) surfaces of Mgo are relatively different from each other in the film thickness direction unlike a case of FIG. 7. Therefore, two kinds of connection pattern are generated as shown in FIGS. 9A and 9B.

In addition, in case that the (110) surfaces of MgO are preferentially oriented parallel to the film surface, the atomic arrangement of FIG. 9A and the atomic arrangement of FIG. 9B are mixed.

In the location surrounded by the circles shown in FIGS. 9A and 9B, the atoms of $Co_2MnZ$ and the atoms of MgO are substantially overlapped with each other.

The atomic arrangements shown in FIG. 7 and FIG. 8A have high lattice matching property (low misfit rate) in the interface between the Heusler alloy and MgO out of the atomic arrangements of FIGS. 7 to 9.

The lattice constant of the Heusler alloy and the lattice constant of mgO are substantially different (the lattice constant depends on materials, the lattice constants of $Co_2MnZ$, $Co_2FeZ$, and XMnSb are generally 5.5 Å to 6.3 Å and the lattice constant of MgO is generally 4.2 Å). In the atomic arrangements of FIGS. 7 and 8A, the positions of the atoms in the Heusler alloy and the positions of the atoms in MgO are substantially set to be the same in the film thickness direction at the interval of several atoms and comparatively many matching locations are formed on the interface between the Heusler alloy and MgO.

In one embodiment, in the atomic arrangement shown in FIG. 8B, since the atoms in the Hesuler alloy and the atoms in MgO are not substantially overlapped with each other, the lattice matching property is reduced in the interface between the Heusler alloy and MgO in comparison with the atomic arrangements of FIGS. 7 and 8A.

The atomic arrangements of FIGS. 9A and 9B show the worst lattice matching property. Accordingly, to improve the lattice matching property more effectively, there is the most preferable the atomic arrangement where the {110} surfaces are preferentially oriented parallel to the film surface in the Heusler alloy and the {100} surfaces are preferentially oriented parallel to the film surface in MgO as shown in FIG. 7.

In one embodiment, in the atomic arrangements of FIG. 8 where the {110} surfaces are preferentially oriented parallel to the film surface of MgO, the atomic arrangement of FIG. 5B having bad matching property and the atomic arrangement of FIG. 8A having excellent crystallinity are mixed. Next to the atomic arrangement of FIG. 7, it is preferable the atomic arrangement where the {110} surfaces are preferentially oriented parallel to the film surface in the Heusler alloy and the {110} surfaces are preferentially oriented parallel to the film surface in Mgo. Alternatively, there is preferable the atomic arrangement where the {110} surfaces are preferentially oriented parallel to the film surface in the Heusler alloy, and a part where the {100} surfaces are preferentially oriented parallel to the film surface and a part where the {110} surfaces are preferentially oriented parallel to the film surface are mixed in Mg.

According to the present embodiment, in the Heusler alloy layer 4c2 shown in FIG. 1, the {110} surfaces are preferentially oriented parallel to the film surface and in Mgo constituting the insulating barrier layer 5, the {100} surfaces or the {110} surfaces are preferentially oriented parallel to the film surface. Therefore, the lattice matching property is improved in the interface between the Heusler alloy layer 4c2 and the insulating barrier layer 5 and the spin polarizability is improved in the interface.

In one embodiment, ordered latticing of MgO is performed by a heat treatment in the course of formation of the tunnel-type magnetic detecting element shown in FIG. 1, thereby obtaining a stable crystalline material. Therefore, the lattice matching property is improved in the interface with the Heusler alloy layer 4c2 and the element diffusion in the interface can be properly suppressed compared to the related art, in spite of the heat treatment.

In the tunnel-type magnetic detecting element according to the present embodiment, it becomes possible to improve the resistance variation rate ($\Delta R/R$) in comparison to the related art.

In one embodiment, in the insulating barrier layer 5, it is preferable that the equivalent crystal planes typically represented by the {100} surfaces are preferentially oriented parallel to the film surface. As described in FIG. 7, it is possible to improve the lattice matching property in the interface between the Heusler alloy layer 4c2 and the insulating barrier layer 5 more effectively, thereby improving the resistance variation rate ($\Delta R/R$) more properly.

In the embodiment shown in FIG. 1, the second fixed magnetic layer 4c is formed in a two-layered structure and the ferromagnetic layer 4c1 is formed on a side connected to the nonmagnetic intermediate layer 4b. In comparison with the second fixed magnetic layer 4c formed of the only Heusler alloy, it is possible to improve the RKKY interaction between the first fixed magnetic layer 4a and the second fixed magnetic layer 4c, thereby maintaining the stable ferromagnetic state.

In the free magnetic layer 6, it is suitable that there is formed the Heusler alloy layer where the equivalent surfaces typically represented by the {110} surfaces are preferentially oriented parallel to the film surface on the enhance layer 6a contacting the insulating barrier layer 5. Accordingly, it is possible to increase the spin polarizability in the interface between the free magnetic layer 6 and the insulating barrier layer 5, thereby improving the resistance variation rate ($\Delta R/R$) more effectively.

In one embodiment, it is preferable that the Heusler alloy layer 4c2 is formed of the metal compound represented by the composition formula of $X_2YZ$. The X represents one or more kinds of elements out of Cu, Co, Ni, Rh, Pt, Au, Pd, Ir, Ru, Ag, Zn, Cd, or Fe. The Y represents one or more kinds of elements out of Mn, Fe, Ti, V, Zr, Nb, Hf, Ta, Cr, Co, or Ni. The Z represents one or more kinds of elements out of Al, Sn, In, Sb, Ga, Si, Ge, Pb, or Zn. Accordingly, it is possible to increase the spin polarizability of the Heusler alloy layer 4c2 more effectively. Moreover, it is possible to improve the lattice matching property in the interface with the insulating barrier layer 5 (it is possible to decrease the misfit rate), thereby improving the resistance variation rate ($\Delta R/R$) more effectively.

In one embodiment, as shown in FIG. 1, the Heusler alloy layer 4c2 is not provided on the fixed magnetic layer 4 and is formed on only the free magnetic layer 6.

It is preferable that the Heusler alloy layer is provided immediately below MgO to improve the film material (orientation) of the insulating barrier layer 5 formed of MgO. However, the Heusler alloy layer is not limited to this structure.

Figure 2:
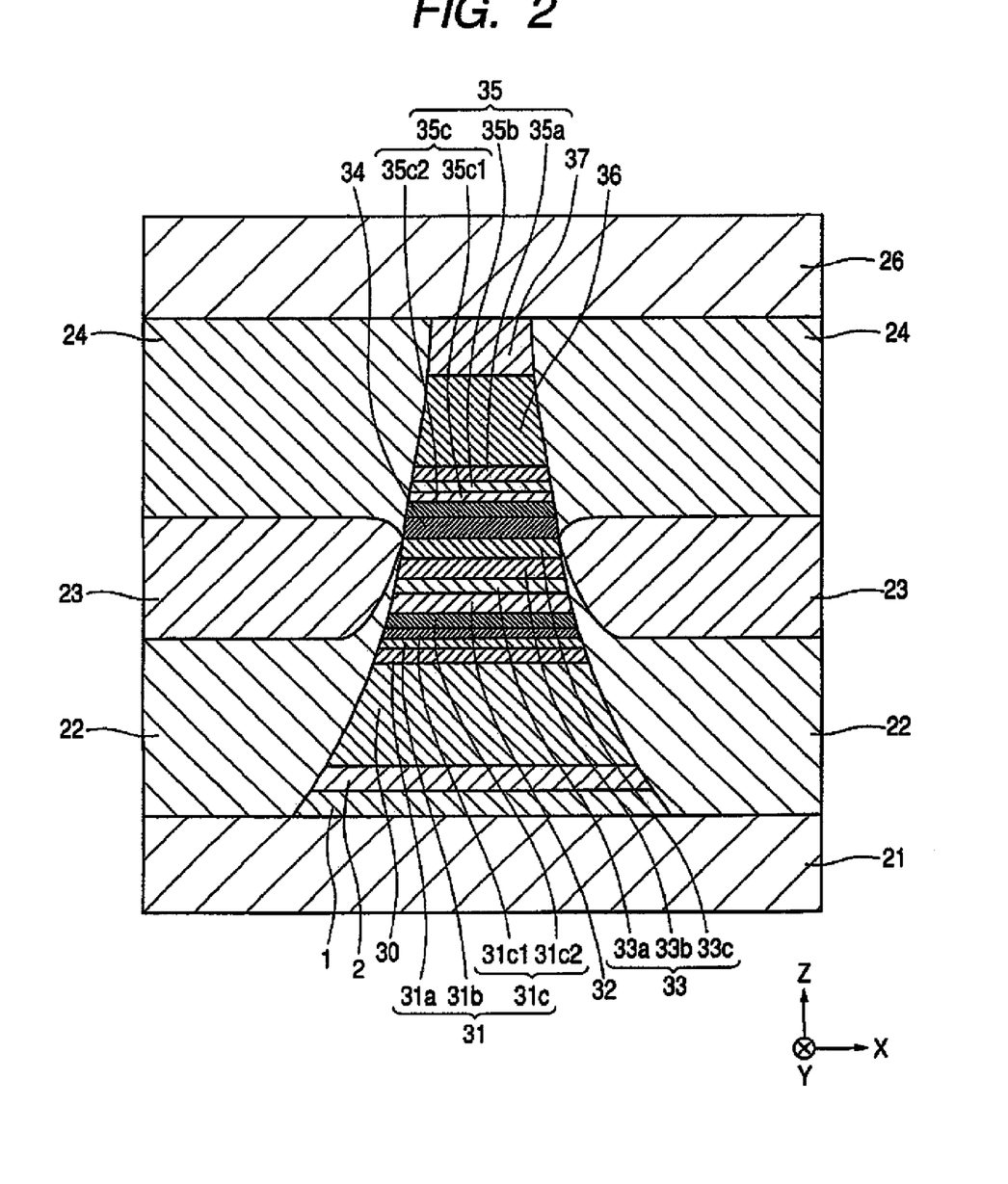
FIG. 2 is a cross-sectional view showing one embodiment of a recording head having a tunnel-type magnetic detecting element cut from a direction parallel to a surface opposite to a recording medium.

FIG. 2 is a cross-section view of a reproducing head having a tunnel-type magnetoresistance effect element of a second embodiment cut from a direction parallel to a surface opposite to a recording medium. In addition, a layer having a same reference numeral shown in FIG. 1 represents the same layer as that of FIG. 1.

In FIG. 2, the tunnel-type magnetic detecting element is dual type. For example, in one embodiment, the laminated body T2 constituting the tunnel-type magnetic detecting element includes the base layer 1, the seed layer 2, a lower antiferromagnetic layer 30, a lower fixed magnetic layer 31, a lower insulating barrier layer 32, a free magnetic layer 33, an upper insulating barrier layer 34, an upper fixed magnetic layer 35, an upper antiferromagnetic layer 36, and the protective layer 37 laminated layer by layer from the bottom to the top.

The lower fixed magnetic layer 31 has the laminated ferri structure where a lower first fixed magnetic layer 31a, a lower nonmagnetic intermediate layer 31b, and a lower second fixed magnetic layer 31c are sequentially laminated from the bottom. In addition, the lower second fixed magnetic layer 31c has a laminated structure that includes the ferromagnetic layer 31c1 and the Heusler alloy layer 31c2.

The upper fixed magnetic layer 35 has a laminated ferri structure that includes the upper second fixed magnetic layer 35c, the upper nonmagnetic intermediate layer 35b, and the upper first fixed magnetic layer 35a, which are sequentially laminated from the bottom. The upper second fixed magnetic layer 35c has a lamination structure that includes the Heusler alloy layer 35c2 and the ferromagnetic layer 35c1, which are laminated.

An enhance layer 33a, a soft magnetic layer 33b, and an enhance layer 33c are sequentially laminated on the free magnetic layer 33.

In an embodiment shown in FIG. 2, the lower insulating barrier layer 32 and the upper insulating barrier layer 34 are formed of MgO, and the equivalent crystal planes typically represented by the {100} surfaces or the {110} surfaces are preferentially oriented parallel to the film surface. The Heusler alloy layers 31c2 and 35c2 contacting the insulating barrier layers 32 and 34 are formed of a metal compound having the Heusler-type crystal structure represented by $X_2YZ$ or XYZ. The equivalent crystal planes typically represented by the {100} surfaces or the {110} surfaces are preferentially oriented parallel to the film surface. The X represents one or more kinds of elements out of Cu, Co, Ni, Rh, Pt, Au, Pd, Ir, Ru, Ag, Zn, Cd, or Fe. The Y represents one or more kinds of elements out of Mn, Fe, Ti, V, Zr, Nb, Hf, Ta, Cr, Co, or Ni. The Z represents one or more kinds of elements out of Al, Sn, In, Sb, Ga, Si, Ge, Pb, or Zn.

Therefore, the lattice matching property is improved in the interface between the Heusler alloy layers 31c2 and 35c2, and the insulating barrier layer 32 and 34, and the spin polarizability is improved in the interface. In addition, the ordered latticing of MgO is performed by a heat treatment in the course of formation of the tunnel-type magnetic detecting element shown in FIG. 2, thereby obtaining a stable crystalline material. Therefore, the lattice matching property is improved in the interface with the Heusler alloy layers 31c2 and 35c2, and the element diffusion in the interface can be properly suppressed rather than that in the related art, in spite of the heat treatment.

Accordingly, in the tunnel-type magnetic detecting element of the present embodiment, it is possible to improve the resistance variation rate ($\Delta R/R$) compared to the related art.

In addition, at least one of the enhance layers 33a and 33c constituting the free magnetic layer 33 is preferably formed of the Heusler alloy layer. More preferably, the enhance layers 33a and 33c are formed on the Heusler alloy layer.

In the embodiment shown in FIG. 2, the Heusler alloy layer is formed on at least one of the top layer of the lower fixed magnetic layer 31, the bottom layer of the upper fixed magnetic layer 35, the top layer of the free magnetic layer, and the bottom layer of the free magnetic layer. However, to properly improve the resistance variation rate ($\Delta R/R$), it is preferable that the Heusler alloy layer is formed on at least one of the top and bottom layers of the lower insulating barrier layers 32 formed of MgO where the {100} surfaces or the {110} surfaces are preferentially oriented. In addition, the Heusler alloy layer is formed on at least one of the top and bottom layers of the insulating barrier layer 36 formed of MgO where the {100} surfaces or the {110} surfaces are preferentially oriented.

A method of manufacturing the tunnel-type magnetic detecting element of the present embodiment will be described. In addition, refer to the materials of the respective layers described in FIG. 1 for the materials of the respective layers.

In the embodiment shown in FIG. 1, the ferromagnetic layer 4c1 and the Heusler alloy layer 4c2 constituting the base layer 1, the seed layer 2, the antiferromagnetic layer 3, the first fixed magnetic layer 4a, the nonmagnetic layer 4b, and the second fixed magnetic layer 4c are consecutively sputter-deposited on the lower shield layer 21.

The Heusler alloy layer 4c2 has a body-centered cubic structure (a bcc structure). The crystal planes typically represented by the {110} surfaces are preferentially oriented parallel to the film surface (the X-Y plane shown in FIG. 1) in the Heusler alloy layer.

Herein, "the crystal planes typically represented by the {110} surfaces" are crystal lattice planes shown using the Miller's index. The equivalent crystal planes represented by the {110} surfaces include the (110) surfaces, (−110) surfaces, (1-10) surfaces, (−1-10) surfaces, (101) surfaces, (−101) surfaces, (10-1) surfaces, (−10-1) surfaces, (011) surfaces, (0-11) surfaces, (01-1) surfaces, and (0-1-1) surfaces.

The Heusler alloy layer 4c2 is preferably formed of the metal compound having the Heusler-type crystal structure represented by $X_2YZ$ or XYZ. The X represents one or more kinds of elements out of Cu, Co, Ni, Rh, Pt, Au, Pd, Ir, Ru, Ag, Zn, Cd, or Fe. The Y represents one or more kinds of elements out of Mn, Fe, Ti, V, Zr, Nb, Hf, Ta, Cr, Co, or Ni. The Z represents one or more kinds of elements out of Al, Sn, In, Sb, Ga, Si, Ge, Pb, or Zn.

In the Heusler alloy layer 4c2, the crystal planes typically represented by the {110} surfaces are preferentially oriented parallel to the film surface (the X-Y plane shown in FIG. 1).

The Heusler alloy layer 4c2 is formed of the metal compound represented by a composition formula of $X_2YZ$. Accordingly, it is possible to increase the spin polarizability of the Heusler alloy layer 4c2.

In a vacuum, the insulating barrier layer 5 formed of MgO is sputter-deposited on the Heusler alloy layer 4c2. In the present embodiment, it is preferable to form the insulating layer 5 formed of MgO by RF-sputtering an MgO target. Therefore, in the insulating barrier layer 5 formed of MgO, the crystal planes typically represented by the {100} surfaces are preferentially oriented parallel to the film surface (the X-Y plane shown in FIG. 1). Herein, "the crystal planes typically represented by the {100} surfaces" are crystal lattice planes shown using the Miller's index. The equivalent crystal planes represented by the {100} surfaces include the (100) surfaces, (−100) surfaces, (010) surfaces, (0-10) surfaces, (001) surfaces, and (00-1) surfaces.

The free magnetic layer 6 and the protective layer 7 are sputter-deposited on the insulating barrier layer 5 in a vacuum after the insulating barrier layer 5 is formed in a predetermined film thickness. Accordingly, the laminated body T1 from the base layer 1 to the protective layer 7 is sputter-deposited on the lower shield layer 21 in vacuum.

The heat treatment is performed in the magnetic field. The treatment is performed so that the magnetic field is oriented in the height direction (the Y direction shown). Therefore, the first fixed magnetic layer 4a and the second fixed magnetic layer 4c constituting the fixed magnetic layer 4 are oriented in a direction parallel to the height direction or in a direction opposite to the height direction.

By the heat treatment in the magnetic field, the ordered latticing of the atoms of the insulating barrier layer 5 formed of Mgo is performed in the interface with the Heusler alloy layer 4c2, thereby obtaining a crystalline material. Therefore, the lattice matching property is improved in the interface and the element diffusion in the interface can be suppressed to the minimum.

As shown in FIG. 1, the laminated body T1 is etched in substantially trapezoidal shape, the width in the tracking width direction (the X direction shown in FIG. 1) decreases gradually from downward to upward. The lower insulating layer 22, the hard bias layer 23, and the upper insulating layer 24 are sequentially laminated in opposite sides of the tracking width direction (the X direction shown in FIG. 1) of the laminated body T1 from the bottom. In addition, the upper shield 26 is formed on the protective layer 7 and the upper insulating layer 24.

In the above-mentioned manufacturing method, the insulating barrier layer 5 formed of Mgo is formed using the MgO target. Accordingly, as described above, the crystal planes typically represented by the {100} surfaces are preferentially oriented parallel to the film surface in the insulating barrier layer 5 and the relationship of the atomic arrangement with the Heusler alloy layer 4c2 is shown in FIG. 7.

Accordingly, by a proper and simple methods it is possible to manufacture the tunnel-type magnetic detecting element capable of improving the lattice matching property in the interface between the insulating barrier layer 5 and the Heusler alloy layer 4c2 (decreasing the misfit rate), improving the spin polarizability in the interface, improving the film material of the insulating barrier layer 5, and increasing the resistance variation rate ($\Delta R/R$).

Alternatively, an Mg layer is deposited on the Heusler alloy layer 4c2 by using an Mg target and by sputtering the Mg target at the time of forming the insulating barrier layer 5. The recording barrier layer 5 formed of MgO may be formed by naturally oxidizing the Mg layer. In this embodiment, the crystal planes typically represented by the {110} surfaces are preferentially oriented parallel to the film surface in the insulating barrier layer 5. In addition, when the Mg layer is formed in the film thickness of the insulating barrier layer 5 and is oxidized, a disoxidized Mg layer may remain in the vicinity of a lower layer of the Mg layer. As the result, it is preferable to forming the Mg layer in the film thickness of the insulating barrier layer 5 by repeating the process that the Mg layer is deposited in a thin film thickness and the Mg layer is naturally oxidized more than once.

At the time of further forming the Heusler alloy layer in the free magnetic layer 6, the insulating barrier layer 5 is formed and the Heusler alloy layer as the free magnetic layer 6 is sputter-deposited. When the Heusler alloy layer is formed in the only free magnetic layer 6 and the Heusler alloy layer is not formed on the fixed magnetic layer 41 the fixed magnetic layer 4 is formed, the insulating barrier layer 5 made of MgO is formed by using any one of two methods described above, and the Heusler alloy layer as the free magnetic layer 6 is formed on the insulating barrier layer 5 (for example, the enhance layer Ga shown in FIG. 1 is formed as the Heusler alloy layer). A method of manufacturing other parts is the same as described above.

In the embodiment shown in FIG. 1, the free magnetic layer (the first ferromagnetic layer) 6, the insulating barrier layer 5, the fixed magnetic layer (the second ferromagnetic layer) 4, and the antiferromagnetic layer 3 are sequentially laminated from the bottom. In this embodiment, the Heusler alloy layer is provided on the top layer of the free magnetic layer 6, the bottom layer of the fixed magnetic layer 4, or the top layer of the free magnetic layer 6 and the bottom layer of the fixed magnetic layer 4.

In addition, the tunnel-type magnetic detecting of the present embodiment may be used as an MRAM (a magnetic random access memory).

Embodiment

Two kinds of tunnel-type magnetic detecting elements in which the insulating barrier layer is formed by different manufacturing methods are manufactured. A basic film of the laminated body T1 constituting the tunnel-type magnetic detecting element is configured from the bottom as follows:

Base layer:Ta (70)/antiferromagnetic layer:PtMn (180)/ fixed magnetic layer [the first fixed magnetic layer: $Co_{90at\%}Fe_{10at\%}$/nonmagnetic layer: Ru (9.1)/second fixed magnetic layer: $Fe_{40at\%}Co_{60at\%}/Co_2MnAl$ (20)]/insulating barrier layer: MgO/free magnetic layer [$Co_{90at\%}Fe_{10at\%}$ (15)/ $Ni_{81.5at\%}Fe_{18.5at\%}$ (25)]/the protective layer: Ta (200)

Herein, a value in a parenthesis represents a film thicknesses and the unit of the value is Å. The heat treatment is performed at 270° C. for 3.5 hours for the basic film configuration.

(First Tunnel-Type Magnetic Detecting Element)

The insulating barrier layer made of MgO by the RF sputter is formed in a film thickness of 8.5 Å by using the MgO target. Under the deposition conditions of an electric power supplied to a sputter device of 600 W, an Ar gas pressure of $8 \times 10^{-2}$ Pa, and a distance between a target and a substrate of 145 mm, the deposition is performed at room temperature and the heat treatment is performed.

(Second Tunnel-Type Magnetic Detecting Element)

By using the Mg target, the Mg layer is formed by depositing the Mg layer in 3 Å by a DC sputter and naturally oxidizing the Mg layer twice. Under the electrical power supplied to the sputter device of 25 W, the Ar gas pressure of $3 \times 10^{-2}$ Pa, and the distance between the target and the substrate of 260 mm, the deposition is performed at room temperature and the heat treatment is performed.

The first tunnel-type magnetic detecting element and the second tunnel-type magnetic detecting element manufactured as described above are cut from a direction parallel to a surface opposite to the recording medium as shown in FIG. 1. An electronic ray (beam) is input to the insulating barrier layer shown on the cut surface in a direction (the Y direction shown in FIG. 1) perpendicular to the opposite surface.

Figure 10A:
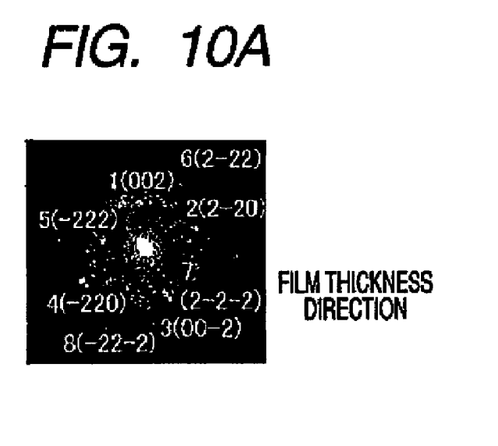
FIG. 10A shows a transmitted electron beam diffraction pattern of an insulating barrier layer in a first tunnel-type magnetic detecting element in which {100} surfaces of an insulating barrier layer formed of MgO and FIG. 10B shows a transmitted electron beam diffraction pattern of the insulating barrier layer in a second tunnel-type magnetic detecting element in which {100} surfaces of the insulating barrier layer formed of Mgo are preferentially oriented parallel to the film surface.
Figure 10B:
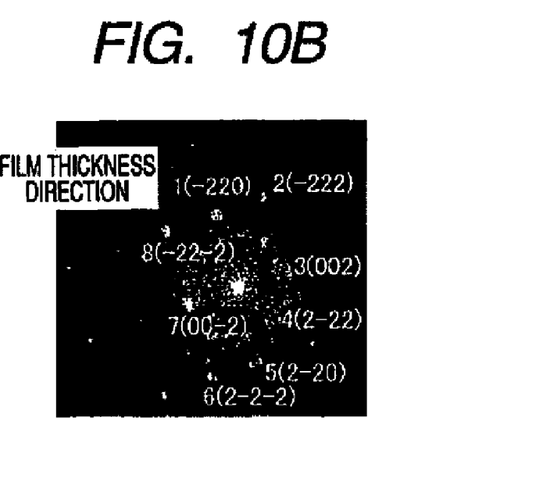

FIG. 10A shows a transmitted electron beam diffraction pattern of the insulating barrier layer in the first tunnel-type magnetic detecting element and FIG. 10B shows a transmitted electron beam diffraction pattern of the insulating barrier layer in the second tunnel-type magnetic detecting element. The transmitted electron beam diffraction image is the pattern showing a diffraction phenomenon caused by scattering of the electron beam when the electron beam is input and transmitted to an object.

The origins are in centers of FIGS. 10A and 10B and diffraction spots corresponding to inverse lattice points representing the crystal planes are generated. It is possible to give indices to the respective diffraction spots by analyzing the diffraction spot pattern. In one embodiment, as shown in FIG. 10A, the MgO layer (the insulating barrier layer) having the face-center cubic structure is deposited in a state that the crystal planes typically represented by the {100} surfaces are preferentially oriented parallel to the interface with the Heusler alloy layer. In one embodiment, as shown in FIG. 10B, the MgO layer (the insulating barrier layer) having the face-center cubic structure is deposited in a state that the crystal planes typically represented by the {110} surfaces are preferentially oriented parallel to the interface with the Heusler alloy layer.

The resistance variation rates ($^\Delta R/R$) of the first and second tunnel-type magnetic detecting elements are measured respectively. In a test, multiple tunnel-type magnetic detecting elements are manufactured and the average value of the resistance variation rates ($^\Delta R/R$) acquired from the respective tunnel-type magnetic detecting elements is acquired.

Figure 11:
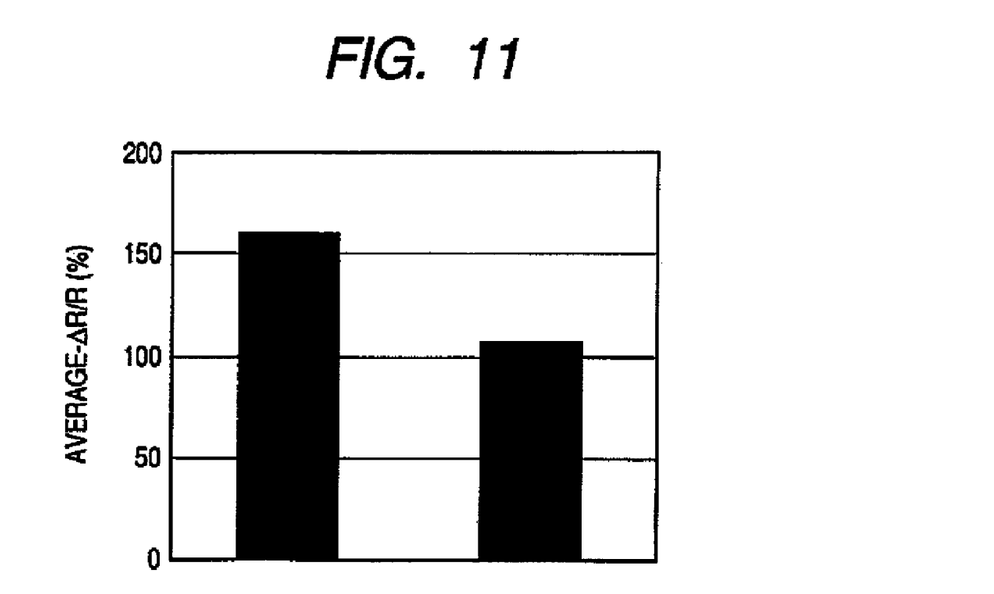
FIG. 11 is a graph showing magnetoresistance variation rates ($\Delta R/R$) of a first tunnel-type magnetic detecting element and a second-type magnetic detecting element.

As shown in FIG. 11, the resistance variation rate ($^\Delta R/R$) of 100% or more is obtained in the first and second tunnel-type magnetic detecting element.

As shown in FIG. 11, it is possible to obtain higher resistance variation rate ($^\Delta R/R$) in the first tunnel-type magnetic detecting element than in the second tunnel-type magnetic detecting element. In the first tunnel-type magnetic detecting element, the {100} surface of MgO as the insulating barrier layer is preferentially oriented parallel to the film surface. As shown in FIG. 7, the lattice matching property with the Heusler alloy layer in the first tunnel-type magnetic detecting element is improved rather than that in the second tunnel-type magnetic detecting element, and the spin polarizability in the interface between the insulating barrier layer and the Heusler alloy layer increases. Therefore, it is possible to obtain high resistance variation rate ($^\Delta R/R$).

Various embodiments described herein can be used alone or in combination with one another. The forgoing detailed description has described only a few of the many possible implementations of the present invention. For this reason, this detailed description is intended by way of illustration, and not by way of limitation. It is only the following claims, including all equivalents that are intended to define the scope of this invention.

The invention claimed is:

1. A tunnel-type magnetic detecting element comprising:
   a first ferromagnetic layer;
   an insulating barrier layer; and
   a second ferromagnetic layer,
   wherein the first ferromagnetic layer, the second ferromagnetic layer, or both have a Heusler alloy layer contacting the insulating barrier layer, and equivalent planes represented by {110} surfaces, are preferentially oriented parallel to a film surface in the Heusler alloy layer, and
   wherein the insulating barrier layer is formed of MgO and the equivalent crystal planes represented by the {100} surfaces are oriented parallel to the film surface.

2. The tunnel-type magnetic detecting element according to claim 1, wherein the equivalent crystal planes represented by the {100} surfaces are preferentially oriented parallel to the film surface in the insulating barrier layer.

3. The tunnel-type magnetic detecting element according to claim 1,
   wherein the first ferromagnetic layer is a fixed magnetic layer, which is fixed in magnetization and the second ferromagnetic layer is a free magnetic layer, which is variable in magnetization by an external magnetic field, and
   wherein the first ferromagnetic layer comprises the Heusler alloy layer.

4. The tunnel-type magnetic detecting element according to claim 1, wherein the Heusler alloy layer is formed of a metal compound having a Heusler-type crystal structure.

5. The tunnel-type magnetic detecting element according to claim 4, wherein the Heusler alloy layer is formed of the metal compound represented by the composition formula of $X_2YZ$.

* * * * *